United States Patent
Adduci et al.

(10) Patent No.: US 7,764,208 B2
(45) Date of Patent: Jul. 27, 2010

(54) CLOCK DITHERING PROCESS FOR REDUCING ELECTROMAGNETIC INTERFERENCE IN D/A CONVERTERS AND APPARATUS FOR CARRYING OUT SUCH PROCESS

(75) Inventors: Pietro Mario Adduci, Settimo Milanese (IT); Edoardo Botti, Vigevano (IT); Giovanni Gonano, Padua (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 57 days.

(21) Appl. No.: 12/275,871

(22) Filed: Nov. 21, 2008

(65) Prior Publication Data

US 2009/0140896 A1   Jun. 4, 2009

(30) Foreign Application Priority Data

Nov. 23, 2007   (EP)   ................... 07425738

(51) Int. Cl.
*H03M 1/20*   (2006.01)
(52) U.S. Cl. ..................... 341/131; 398/195
(58) Field of Classification Search ......... 341/125–170; 398/195, 198, 202
See application file for complete search history.

(56) References Cited

U.S. PATENT DOCUMENTS

| | | | | |
|---|---|---|---|---|
| 5,426,392 A | * | 6/1995 | Kornfeld | .................... 327/551 |
| 5,963,157 A | * | 10/1999 | Smith | .................... 341/131 |
| 6,222,861 B1 | * | 4/2001 | Kuo et al. | .................... 372/20 |
| 6,294,936 B1 | | 9/2001 | Clementi | |
| 6,941,333 B2 | * | 9/2005 | Akune et al. | .................... 708/313 |
| 6,958,635 B2 | * | 10/2005 | Fahim | .................... 327/155 |
| 7,079,616 B2 | | 7/2006 | Castiglione et al. | |
| 7,098,708 B2 | * | 8/2006 | Fahim | .................... 327/155 |
| 7,184,671 B2 | * | 2/2007 | Wang | .................... 398/195 |
| 7,233,746 B2 | * | 6/2007 | Blake et al. | .................... 398/202 |
| 7,493,052 B2 | * | 2/2009 | Blake et al. | .................... 398/208 |
| 2003/0058053 A1 | | 3/2003 | Jeon et al. | |
| 2005/0152561 A1 | | 7/2005 | Spencer | |

* cited by examiner

*Primary Examiner*—Lam T Mai
(74) *Attorney, Agent, or Firm*—Lisa K. Jorgenson; Seed IP Law Group PLLC; E. Russell Tarleton

(57) ABSTRACT

A process and apparatus for generating an output signal whose frequency varies according to a modulation scheme, the process including the steps of providing a dither generator for receiving a first input signal representative of a clock frequency and for generating, according to the modulation scheme, a dithered output signal representative of the first signal at a dithered frequency; providing a DSP for receiving the following input signals: the signal at the dithered frequency and a second signal representative of a clock frequency, the DSP adapted to generate a processed output signal representative of the maximum frequency of the second signal; wherein the modulation scheme has a periodic ultrasonic modulating wave.

20 Claims, 7 Drawing Sheets

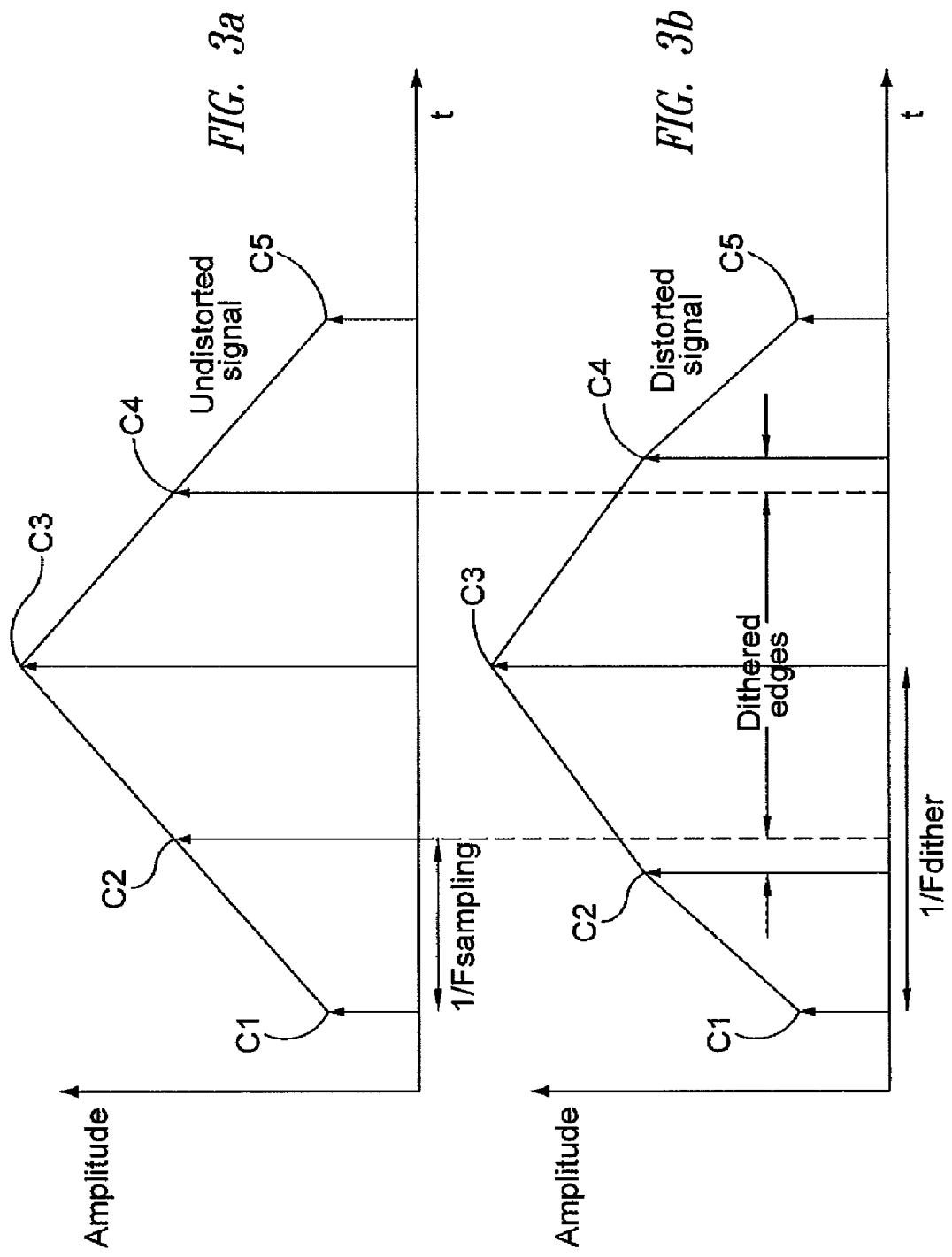

CLOCK DITHERING PROCESS FOR REDUCING ELECTROMAGNETIC INTERFERENCE IN D/A CONVERTERS AND APPARATUS FOR CARRYING OUT SUCH PROCESS

BACKGROUND

1. Technical Field

The present disclosure relates to a clock dithering process and apparatus for reducing electromagnetic interference in D/A converters, particularly audio D/A converters.

2. Description of the Related Art

The standards for radio-frequency interference in electronic apparatus have become increasingly stringent, especially in the automotive field, such as a radio, CD player or other audio or audio-visual device.

For example, according to such standards, the spectrum of a signal picked up by an antenna that has a specially regulated position relative to an apparatus undergoing an electromagnetic interference test, is below a preset threshold 1, e.g., a threshold having the profile as shown in FIG. 1.

On the other hand, the diagram of FIG. 2 shows a case in which the apparatus under test emits radiation above the preset threshold 1, which is picked up by the antenna. Due to noise, the antenna might pick up a plurality of peaks 2, 3 and 4 that exceed the limit defined by the threshold 1.

If the equipment under test is a digital electronic apparatus or a switching type apparatus, such as a class D digital amplifier, this high frequency noise is typically composed of clock harmonics of the equipment, and this noise can generate peaks, the shape and position of which are shown in FIG. 2.

One of the methods employed to reduce the amplitude of these peaks consists in frequency/phase modulation of the clock signal using a process commonly known as dithering, which is known to those of ordinary skill in the art and will not be described in further detail. For the purposes hereof, it shall be noted that the dithering process provides a clock signal having a frequency spectrum that no longer has one peak at the clock frequency and multiples thereof, but several peaks around the clock frequency, which can be reduced by as much as 20 dB.

This can be achieved by increasing the modulation index "m," which is defined as the ratio of the maximum frequency deviation from the typical value (max ΔFclock) and the modulating frequency (fm);

$m = \max \Delta F \text{clock}/\text{fm}.$

Due to this attenuation of peak values, the equipment under examination exhibits an improved response to the electromagnetic interference test. Thus, the clock dithering process is often used in equipment in which the clock signal need not be synchronized with other undithered clock signals external to the equipment.

In audio D/A converters, particularly those D/A converters whose power output is designed to drive loudspeakers, the dithering process would initially seem to require a considerable increase of circuit complexity with the additional risk of worsening the linearity performance and dynamic range of the system, which has to be very high in audio converters.

Typically, a clock dithering process in audio D/A converters is carried out by modulating a V.C.O. (Voltage Controlled Oscillator) with a modulating signal having an infrasonic modulation frequency, i.e., a low modulation frequency, typically of less than 20 Hz.

Nevertheless, increased difficulties occur if the clock signal of a D/A converter comes from an input clock signal through a Phase Locked Loop (PLL) because, when the input signal to the D/A converter is an audio signal, modulation of the clock signal is likely to worsen signal quality, due to intrinsic jitter caused by dithering.

Referring to FIGS. 3a and 3b, which show possible ideal (FIG. 3a) and actual (FIG. 3b) reconstructions of five samples C1-C5 with a sampling frequency above the dither frequency, it can be seen that, in the actual reconstruction (see FIG. 3b), the samples C2 and C4 are offset in time relative to the same samples C2 and C4 of the ideal reconstruction (see FIG. 3a). Such time offset causes distortion of the reconstructed signal, which leads to obvious imaginable consequences in terms of quality of the signal transmitted to the loudspeakers.

A PLL modulation example that does not meet the quality and simplicity requirements required of audio D/A converters is disclosed in U.S. Pat. No. 7,079,616 in which the dithering process is carried out by causing the division factor of the VCO feedback loop to be varied using an infrasonic triangular wave.

BRIEF SUMMARY

Therefore, the disclosed embodiments provide a clock dithering process and apparatus that can be used in a signal processing chain for high performance D/A conversion. Furthermore, the disclosed embodiments provide a clock dithering process and apparatus of greater simplicity and cost-effectiveness than in prior devices due to its full monolithic integration and to the lack of audio signal degradation.

In accordance with one embodiment of the present disclosure, a process for generating an analog audio output having a frequency that varies according to a modulation scheme is provided, the process including the steps of providing a dither generator that implements a receiving of a first input signal representative of a first clock frequency and generating, according to said modulation scheme, a dithered output signal representative of said first signal at a dithered frequency and comprising a periodic ultrasonic modulating wave; providing a DSP that implements a receiving of the following input signals: the dithered output signal at the dithered frequency and a second signal representative of a second clock frequency, the DSP generating a processed output signal representative of a maximum frequency of the second signal.

In accordance with another embodiment of the present disclosure, an apparatus for generating an analog audio output signal having a frequency that varies according to a modulation scheme is provided. The apparatus includes a dither generator for receiving a first input signal representative of a clock frequency and for generating, according to the modulation scheme, an output signal representative of a dithered frequency; a DSP for receiving the input signal representative of the dithered frequency and a second signal representative of a clock frequency, the DSP adapted to generate a processed output signal representative of the maximum frequency of the second signal, wherein the dither generator operates at a frequency imposed by the modulation scheme, the modulation scheme having a periodic ultrasonic modulating wave.

In accordance with another aspect of the foregoing embodiment, the apparatus includes a first PLL having a first phase detector responsive to phase deviation between an input signal representative of a clock frequency and a first feedback signal, the first phase detector adapted to drive a first oscillator, according to such deviation, to generate a dithered oscillator output signal, the first PLL further including a feedback loop responsive to the dithered output signal generated by the oscillator and generating the first feedback signal through at least one second divider, wherein the first PLL includes: the dither generator having a periodic ultrasonic wave to modulate the first oscillator and generate the dithered oscillator output signal; a first circuit for varying the frequency of the periodic ultrasonic modulating wave of the dither generator so that the frequency is equal to or is a multiple of the frequency of the input signal of the phase detector, in which:

$$Fdit = N * Fphd\_loop\_1$$

where Fdit is the frequency of the periodic ultrasonic modulating wave, Fphd_loop_1 is the frequency of the feedback signal, N is an integer and the frequency Fphd_loop_1 being, in steady-state conditions, equal to the frequency of the input signal of the first phase detector.

In accordance with another aspect of the foregoing embodiment, the apparatus includes a second PLL having a second phase detector responsive to phase deviation between the input signal representative of a clock frequency and a second feedback signal, the second phase detector adapted to drive a second oscillator, according to such deviation, to generate an undithered oscillator output signal, the second PLL further including a feedback loop responsive to the undithered output signal generated by the second oscillator and generating the second feedback signal through at least one fifth divider, wherein the second PLL includes: a sixth divider for receiving the undithered output signal generated by the second oscillator and for obtaining the processed output signal in the undithered version; a second circuit for varying the frequency of the periodic ultrasonic modulating wave of the dither generator according to the undithered oscillator output signal to modulate the first oscillator and thus generate the dithered oscillator output signal; a seventh divider for receiving, at the input thereof, the dithered oscillator output signal and for obtaining, at the output of the seventh divider the signal representative of the dithered frequency; the DSP receiving at its input, the signal representative of the dithered frequency and the second signal representative of a clock frequency and generating at its output the processed signal in the dithered version, a latch array for latching the processed signal in the dithered version and the undithered output signal.

In accordance with another embodiment of the present disclosure, a method is provided that includes receiving a first clock signal; generating a dithered output signal responsive to the first clock signal, the dithered output signal including a periodic ultrasonic modulating wave in accordance with a modulation scheme; receiving a second clock signal and the dithered output signal; and generating a processed output signal in response to the second clock signal and the dithered output signal for generating an audio output signal.

In accordance with another aspect of the foregoing embodiment, the method includes generating the dithered output signal with a periodic ultrasonic modulating wave in accordance with a modulation scheme that uses a triangular wave modulation scheme. In a preferred embodiment, the modulation of the dithered output signal is done in a manner that the dithered output signal is a multiple of or equal to an oversampling frequency. Preferably, the oversampling frequency is a maximum oversampling frequency of the second clock signal.

In accordance with another aspect of the foregoing embodiment, the dithered output signal includes modulating a first oscillator with the modulation scheme having the periodic ultrasonic wave to generate the dithered output signal, and further wherein modulating the dithered output signal comprises varying a frequency of the periodic ultrasonic modulating wave so that the frequency of the dithered output signal is equal to or a multiple of the oversampling frequency.

BRIEF DESCRIPTION OF THE SEVERAL VIEWS OF THE DRAWINGS

The features and advantages of the present disclosure will appear from the following detailed description of the practical embodiments, which are illustrated without limitation in the annexed drawings, in which:

FIGS. 3a and 3b are respective ideal (FIG. 3a) and actual (FIG. 3b) graphical signal reconstruction representations from a preset number of samples;

FIG. 4a shows a block diagram of a first embodiment of an apparatus of the present disclosure;

FIG. 4b shows a plurality of diagrams d1-d5 relating to the process carried out with the apparatus of FIG. 4a;

FIG. 6b shows a plurality of diagrams relating to the process carried out with the apparatus of FIG. 6a;

FIG. 7 is a possible circuit implementation of certain elements of the apparatus of FIG. 6a.

DETAILED DESCRIPTION

Figure 1:
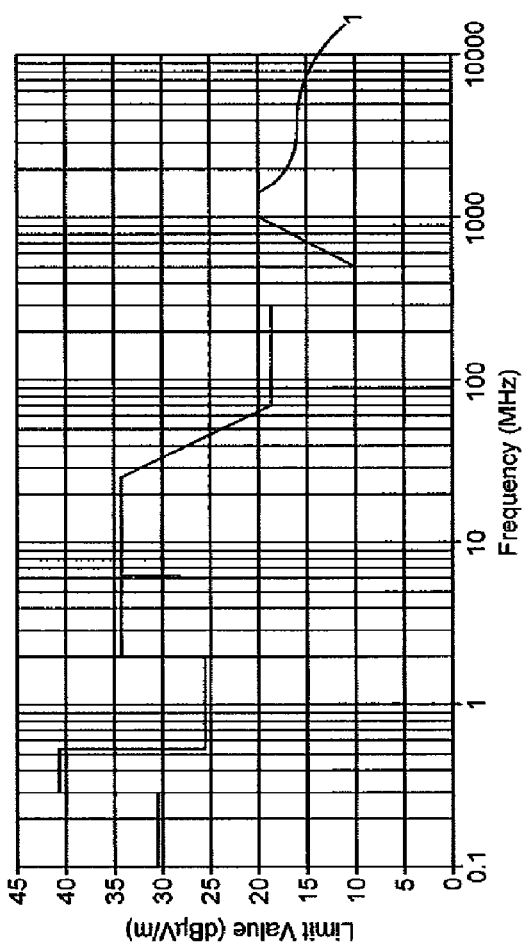
FIG. 1 shows the profile of a given threshold according to test specifications for regulating radio interference of an apparatus under test.
Figure 2:
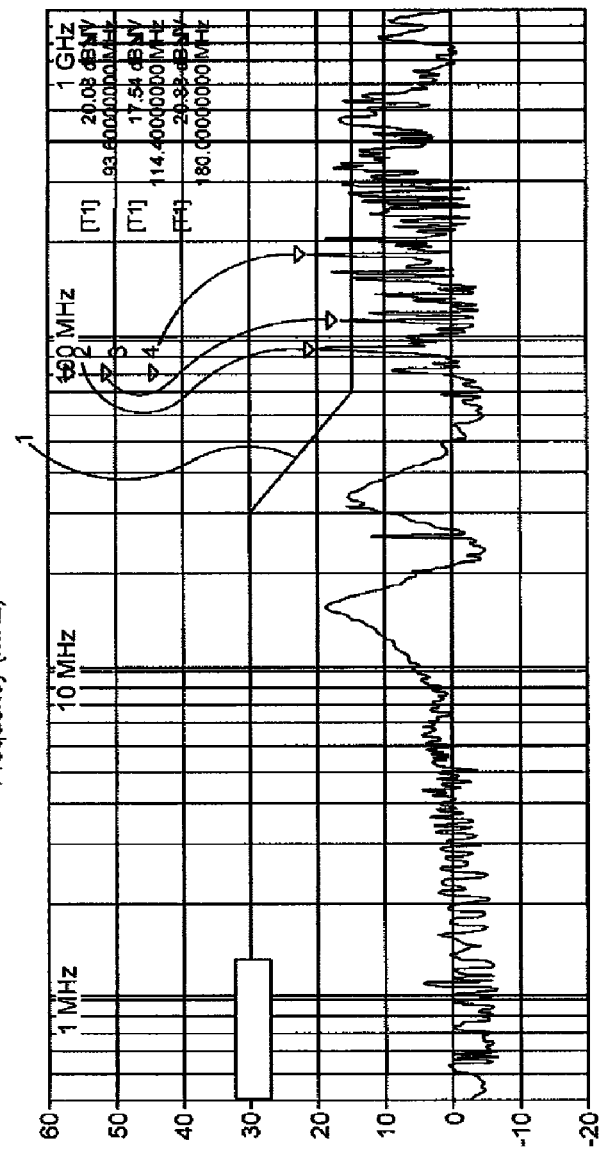
FIG. 2 shows an emission spectrum of the apparatus under test, such spectrum having peaks above the threshold imposed by the test specifications as shown in FIG. 1 and being picked up by an antenna.
Figures 4A, 4B:
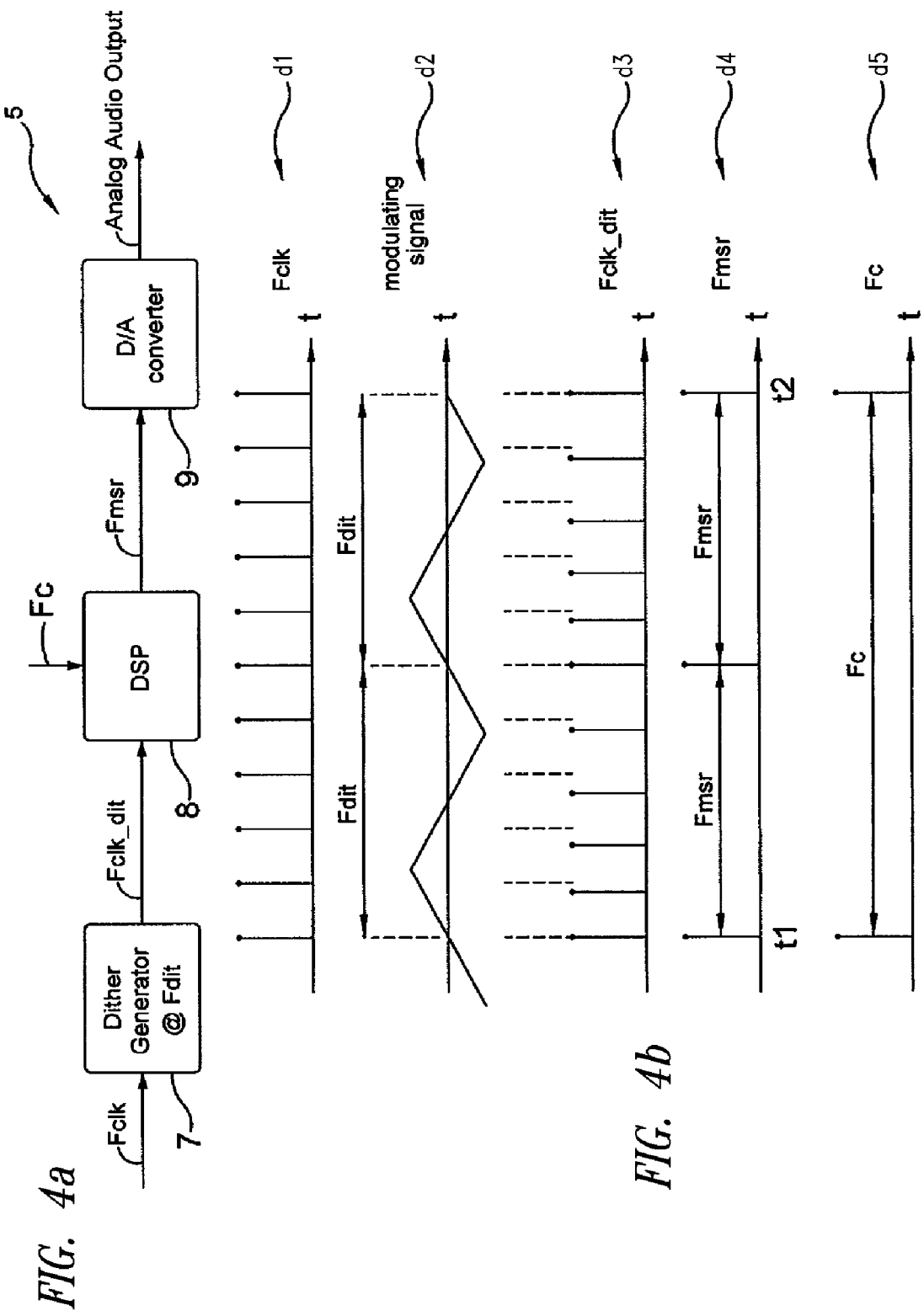

Referring to FIGS. 4a and 4b, there are shown in FIG. 4a a block diagram of a first embodiment of an apparatus 5 and in FIG. 4b a plurality of diagrams d1-d5 relating to the process carried out with the above apparatus 5 of FIG. 4a, respectively.

Particularly, the apparatus 5 is configured for receiving an audio bit stream and generating an Analog Audio Output signal whose frequency varies according to a preset modulation scheme.

For this purpose, the apparatus 5 has a processing chain that includes a dither generator 7, a DSP 8, and a digital-to-analog D/A converter 9.

Particularly, the dither generator 7 is designed to receive a first input signal Fclk representative of the clock frequency of the apparatus 5 and for generating, according to said modulation scheme, a dithered output signal Fclk_dit, the latter being representative of the dithered version of the first signal Fclk.

The first signal Fclk, whose graphical representation d1 is shown in FIG. 4b, shows the clock or synchronization signal of the apparatus 5.

For instance, a typical value for such clock frequency Fclk is about 3 MHz. Particularly, the DSP 8 is designed to receive the dithered input signal Fclk_dit and a second signal representative of another clock frequency Fc. Such DSP 8 can generate a processed output signal Fmsr representative of the maximum frequency of said second signal Fc, i.e., the maximum oversampling frequency Fmsr of the signal Fc.

The second clock signal Fc represents the clock frequency of the audio bit stream.

The dithered output signal Fclk_dit, the second signal Fc and the maximum oversampling frequency Fmsr are graphically shown in FIG. 4b, with respective designations d3, d5, and d4. For instance, a typical value for such clock frequency Fc is about 44.1 KHz.

Advantageously, the DSP 8 generates the maximum oversampling frequency output signal Fmsr due to the characteristic according to which the modulation scheme that regulates the dither generator 7 is a modulating scheme having a periodic ultrasonic modulating wave. In other words, the dither generator 7 operates at a dither frequency Fdit imposed by the modulation scheme, which in turn has a periodic ultrasonic modulating wave.

For instance, a typical value for such dither frequency Fdit whereat the dither generator 7 operates is equal to or higher than 20 KHz. Preferably, the modulation scheme is obtained using a triangular wave d2 as shown in FIG. 4b. It shall be noted that, for proper operation of the apparatus 5, the dither frequency Fdit shall meet the following condition:

$$Fdit=M*Fmsr, \text{with M being an integer} \quad (1)$$

i.e., the dither frequency Fdit of the dither generator 7 shall be equal to or multiple of the maximum oversampling frequency Fmsr of the audio signal Fc in the signal processing chain of the DSP 8. It shall be noted that, in any case, the maximum oversampling frequency Fmsr is an integer multiple of Fc, due to the oversampling performed by the DSP.

In other words, the DSP 8 has a divider block M, not shown in FIG. 4a, so that the signal representative of the dithered frequency Fclk_dit is at least equal to or multiple of said processed signal Fmsr, according to the formula (1).

According to the condition (1), it can be noted that the time samples t1 and t2 of the signal Fmsr (graphical representation d2 of FIG. 4d) would be in the same position even with no dither. Should this not occur, the output signal Fc would be sampled at a non constant frequency, and a time error would be caused at the Analog Audio Output, i.e., a distortion as shown in FIG. 3b. Nevertheless, a condition often occurs in which the value of the frequency Fclk of the apparatus 5 provided to the DSP 8 is not sufficient for proper processing of the signals having the frequency Fc.

Figure 5:
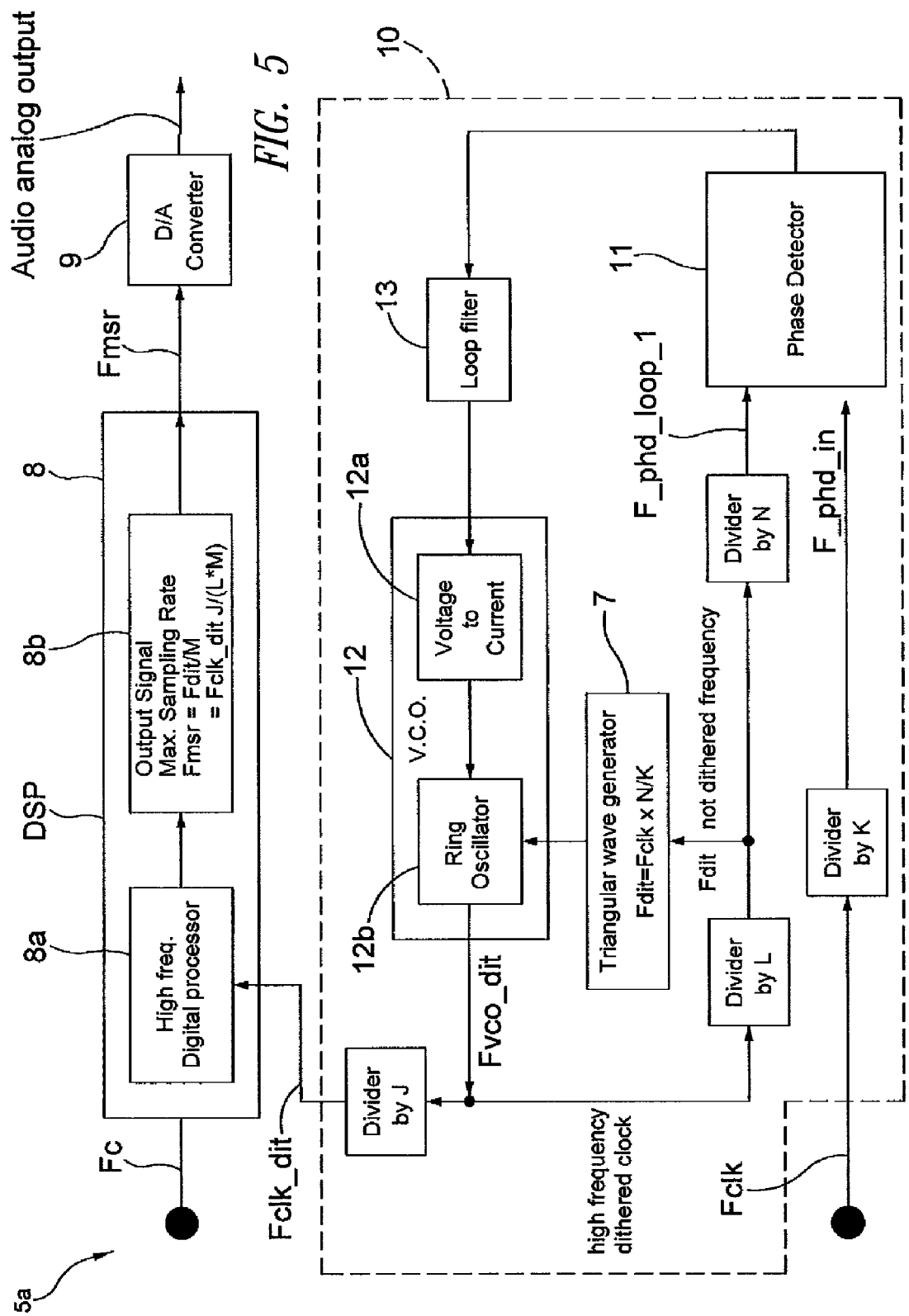
FIG. 5 shows another block diagram of a second embodiment of the apparatus of the present disclosure.

Referring to FIG. 5, in order to obtain a higher frequency Fclk, i.e., a higher processing frequency for the DSP 8, changes have to be made to the apparatus 5 of FIG. 4a for a PLL 10 to be included therein, so that an apparatus 5a may be implemented for generating the Analog Audio Output signal with a frequency varying according to the modulation scheme.

For this purpose, the apparatus 5a has a processing chain comprising a PLL 10, a DSP 8, and a digital-to-analog D/A converter 9.

For instance, the DSP 8 has a digital device 8a for processing high frequencies and a second digital device 8b for sampling the output signal at the maximum sampling frequency.

Advantageously, the PLL 10 is configured to generate a clock signal Fclk_dit whose frequency has to be dithered with respect to the clock frequency value. Particularly, the PLL 10 shall be able to generate the dithered clock signal Fclk_dit. For this purpose the PLL 10 shall advantageously comprise the dither generator 7 in addition to the classical elements (such as a VCO 12, a phase detector 11, a loop filter 12, and frequency dividers K, L, N and J) that form a general PLL for generating an undithered clock signal.

It shall be noted that the circuit elements, such as the VCO 12, the phase detector 11, the loop filter 13 and the frequency dividers K, L, N and J included in the PLL 10 are well known to those of ordinary skill in the art and will not be further described in detail. For the purposes of the present disclosure, it shall be noted that the oscillator 12 comprises a circuit 12a for converting voltage into current and a ring oscillator 12b.

The phase detector 11 is responsive to phase deviation between an input signal Fphd_in, representative of the clock frequency of the clock signal Fclk (or the signal Fc) and a feedback signal Fphd_loop_1. Therefore, the phase detector 11 can drive the VCO 12 according to such deviation, to generate a dithered oscillator output signal Fvco_dit.

The PLL 10 further includes a feedback loop responsive to the dithered output signal Fvco_dit generated by said oscillator 12, said loop comprising, amongst other elements, the loop filter 13. Furthermore, the feedback loop of the PLL 10 generates the feedback signal Fphd_loop_1 through at least one divider block L,N.

In the preferred embodiment of the apparatus 5a two separate divider blocks L and N are provided, each of which is able to perform a modulation on the signal Fvco_dit on the feedback loop of the PLL 10. Advantageously, the PLL 10 further includes the dither generator 7 which can implement the modulation scheme having a periodic ultrasonic modulating wave.

In other words, the dither generator 7 operates at a dither frequency Fdit imposed by the modulation scheme, which in turn has a periodic ultrasonic modulating wave, whose frequency is 20 KHz or more. Preferably, the modulation scheme having the periodic ultrasonic modulating wave is obtained using a wave having a triangular shape or approximating a triangular wave 6b as shown in FIG. 4b.

Therefore, the dither generator 7 particularly operates at the dither frequency Fdit imposed by the modulation scheme. For this purpose, suitable means (not shown) are provided for adjusting the dither frequency Fdit whereat the dither generator 7 operates.

Advantageously, the dither frequency Fdit shall be equal to or multiple of the frequency of the input signal Fphd_in of said phase detector 11, that is:

$$Fdit=N*Fphd\_loop\_1 \quad (2)$$

where Fdit is the frequency of said periodic ultrasonic modulating wave, Fphd_loop_1 is the frequency of said feedback signal, N is an integer and the frequency Fphd_loop_1 being, in steady-state conditions, equal to the frequency of the input signal (Fphd_in) of said phase detector.

Therefore, in addition to the previous condition (1) that links the Fmsr to the Fdit of the dither generator 7, the apparatus 5a shall also meet the condition (2), requiring the frequency Fdit of the dither generator 7 to be equal to or multiple of the frequency of the synchronization signal Fphd_in at the input of the phase detector 11. This condition is required for the phase detector 11 to detect no frequency variation in the signal Fphd_loop_1 caused by the frequency Fdit of the ultrasonic modulating wave.

Particularly, the voltage modulating wave of the dither generator 7, i.e., the triangular modulating wave having a frequency Fdit, has a frequency that is equal to the frequency of the output signal from the oscillator 12 as modulated by the divider L, which means that the frequency Fdit can be expressed as:

$$Fdit=Fvco\_dit/L \quad (3)$$

The voltage of the modulating signal is converted into current and added to that controlled by the loop filter 13 and thence modulates the current that controls the oscillator 12.

It shall be noted that Fdit can be also expressed by simple calculations, such as:

$$Fdit=Fclk*N/K$$

The clock signal Fclk_dit (dithered and obtained from Fvco possibly divided by the divider J), provides the calculation frequency of the DSP 8. Due to the dither effect, radiation emission from the antenna can be limited and test specifications can be more easily met.

It shall be noted that the output of the DSP 8 is at the undithered frequency Fsmr. In other words, the condition (2) is required for the phase detector 11 to detect no frequency variation in the signal Fphd_loop_1 due to the modulating wave, i.e., to prevent any interference between the feedback signal Fphd_loop_1 of the PLL 11 and the dithering process implemented by the dither generator 7.

For instance, assuming the following frequency values:
Fphd_in=44,100 Hz=Fc
Fvco_dit=Fphd_in*N*L=2,822,400 Hz, with N*L=64
Fvco_dit=Fphd_in*N*L=705,600 Hz, with N*L=4
Fdit=1,411,200 Hz=2*Fmsr=>K=1, N=16, L=4, M=1 an effective modulation of the clock signal Fclk is obtained, whereas at submultiples of the frequency Fdit a zero dithering effect is obtained, completely transparent to the feedback action of the PLL 11.

Since electromagnetic interference in the apparatus 5a essentially occurs at the clock frequency Fclk, because any transition is associated to a current absorption peak, such clock signal Fclk has to be dithered whereas the submultiples of such clock signal need not be dithered.

Particular advantages are achieved by selecting the modulation frequency Fdit for the dither generator 7 such that Fdit is a frequency above the audio frequencies Fc, in that the generation of the modulation scheme waveform which is preferably a triangular dithering wave, may be obtained from easily integrable components, where the time constants involved therein are easily controllable and, by suitable component sizing, the modulation index "m" may be allowed to be independent of process spreads unless component matching occurs.

Conversely, considering that the Fc frequency is constant, any frequency variation in the signal due to the feedback of the PLL 11 to the input of the phase detector 11 would cause in turn a frequency variation in the VCO 12. Therefore, such periodic signal variation on the phase detector 11 generates a spurious tone on the VCO 12, which intermodulates with the same periodicity as the signal Fc.

Thus, assuming that the frequency values are:
Fvco_dit=3 Mhz the average lock-in frequency of the VCO, the modulating wave Fdit has a frequency Fdit=Fvco/50=60 KHz, and Fphd_in=Fvco/60=50 KHz, then the phase detector 11 detects the two signals Fphd_in and Fphd_loop_1, which are again in phase after 300 periods of the Fvco_dit, i.e., at a frequency Fvco_dit/300=10 Khz.

Even when the selected dithering frequency Fdit is as high as to be above the audio range, the phase detector 11 generates a perturbation in the VCO 12 at an average frequency well below the dithering frequency, possibly even as low as to be in the audio range. Nevertheless, there are cases in which it is desired to change the oversampling frequency Fmsr of the audio input signal Fc to the D/A converter 9 during operation of the apparatus 5a, so that the frequency Fmsr is still a multiple of Fc but need not be a multiple of the modulation frequency Fdit.

In these cases, the conditions (1) and (2) cannot be imposed on the signal frequencies as described above with reference to the embodiment of FIG. 5. This is because the frequency Fc is imposed from outside the apparatus 5a and if the oversampling frequency Fmsr has to be changed as described above, the conditions (1) and (2) cannot be met at the same time.

The simplest solution in these cases would be to change the division factor of the divider block K by unlocking the PLL 10 from the synchronization signal Fclk, which involves the risk of losing audio data (with possible audible pops or clicks) in the transient in which a frequency change occurs at the PLL 10. To obviate such data loss, i.e., to keep the PLL 10 locked in without losing data, the diagram of the apparatus 5b as shown in FIG. 6a may be used.

Figure 6A:
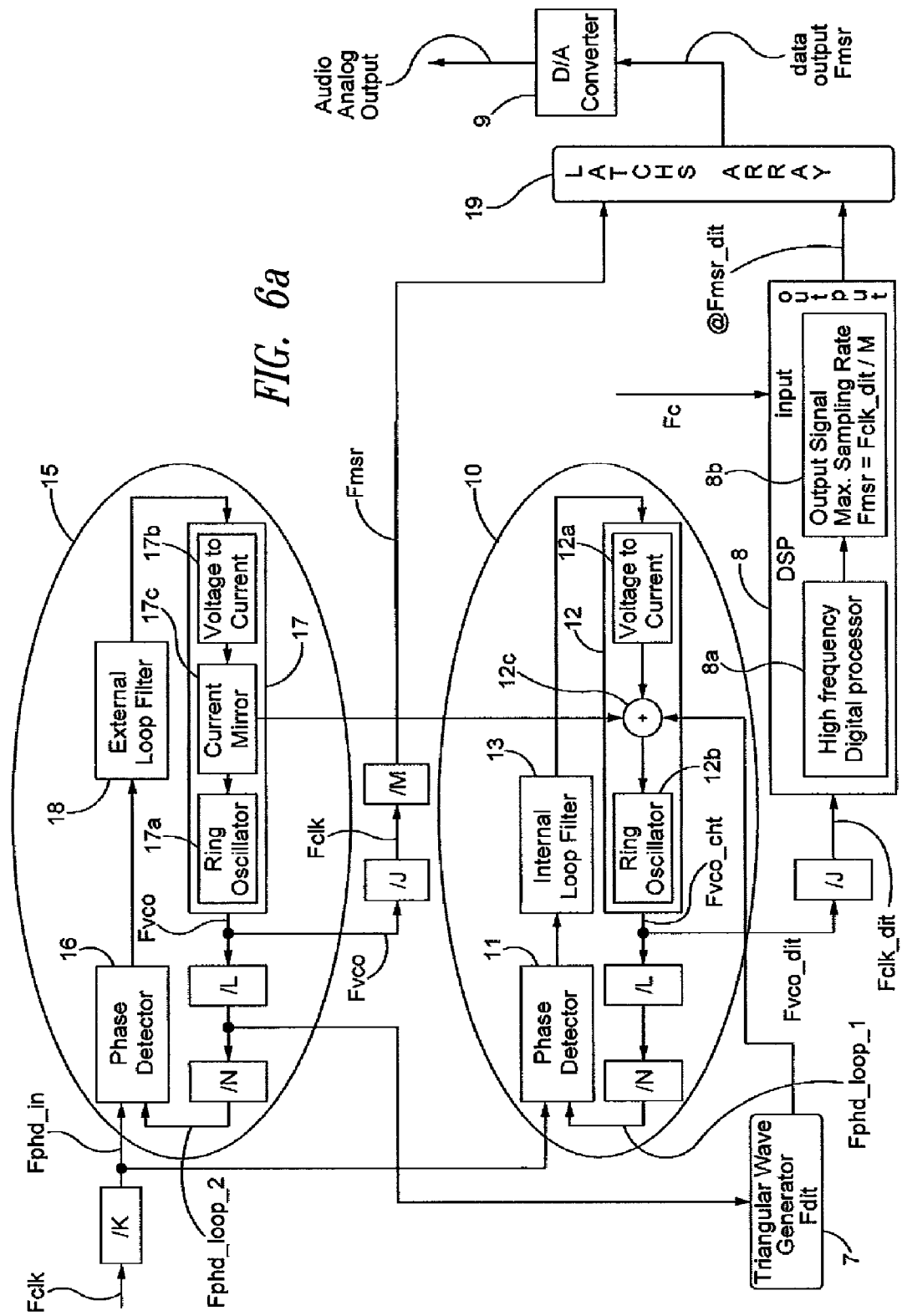
FIG. 6a shows another block diagram of a third embodiment of the apparatus of the present disclosure.

Referring to FIG. 6a, in which the elements described above are designated by identical reference numerals, this additional embodiment for the apparatus 5b includes a PLL 10, the DSP 8, the digital-to-analog D/A converter 9, and a second PLL 15. Particularly, the second PLL 15 shall be of the type that can generate a clock signal whose frequency need not be dithered with respect to the clock frequency Fclk.

For this purpose, the second PLL 15 has a second phase detector 16 responsive to the phase deviation between said input signal Fphd_in representative of a clock frequency Fclk or the frequency Fc and a second feedback signal Fphd_loop_2. The second phase detector 16 can drive a second VCO 17 according to such deviation to generate an undithered oscillator output signal Fvco.

For example, the oscillator 17 has converter 17a for converting voltage into current and a ring oscillator 17b, as well as a current mirror 17c for mirroring the current of the means 17a to a summing node 12c of the oscillator 12 that is part of the first PLL 10. The second PLL 15 further includes a feedback loop responsive to the undithered output signal Fvco generated by the oscillator 17, the loop comprising, amongst other elements, an external loop filter 18. The feedback loop of the second PLL 15 generates the second feedback signal Fphd_loop_2 through at least one fifth divider L,N.

In the preferred embodiment of the apparatus 5b, two separate divider blocks L and N are provided, each of which is able to perform a modulation on the signal Fvco in the feedback of the second PLL 15. Advantageously, the second PLL 15 further comprises includes at least one sixth divider J, M for receiving the undithered output signal Fvco generated by the second oscillator 17 and for obtaining the processed output signal Fmsr in the undithered version.

In the preferred embodiment of the apparatus 5b, two separate divider blocks J and M are provided, each of which is able to perform a modulation on the signal Fvco in the feedback loop of the PLL 15. Advantageously, the apparatus 5b further includes the dither generator 7, which can implement the modulation scheme having a periodic ultrasonic modulating wave. In other words, the dither generator 7 operates at a dither frequency Fdit imposed by the modulation scheme, which in turn has a periodic ultrasonic modulating wave, whose frequency is 20 KHz or more.

Preferably, the modulation scheme having the periodic ultrasonic modulating wave is obtained using a wave having a triangular shape or approximating a triangular wave 6b as shown in FIG. 4b.

Therefore, the dither generator 7 particularly operates at the dither frequency Fdit imposed by the modulation scheme. For this purpose, a suitable circuit (not shown) are provided for adjusting the dither frequency Fdit whereat the dither generator 7 operates.

Therefore, at the output of the dither generator 7 there is the dithered oscillator output signal Fvco_dit, which is inputted to the oscillator 12 to modulate the output signal of the dithered oscillator Fvco_dit.

The apparatus 5b further comprises an additional divider block J, which can receive at its output the dithered oscillator output signal Fvco_dit of the oscillator 12 of the first PLL 10 and provides at its output the dithered clock signal Fclk_dit. The latter dithered clock signal Fclk_dit is the signal that the DSP 8 requires for generating the processed output signal Fmsr in the dithered version, by receiving at its input the signal representative of the dithered frequency Fclk_dit and the clock signal Fc.

Figure 6B:
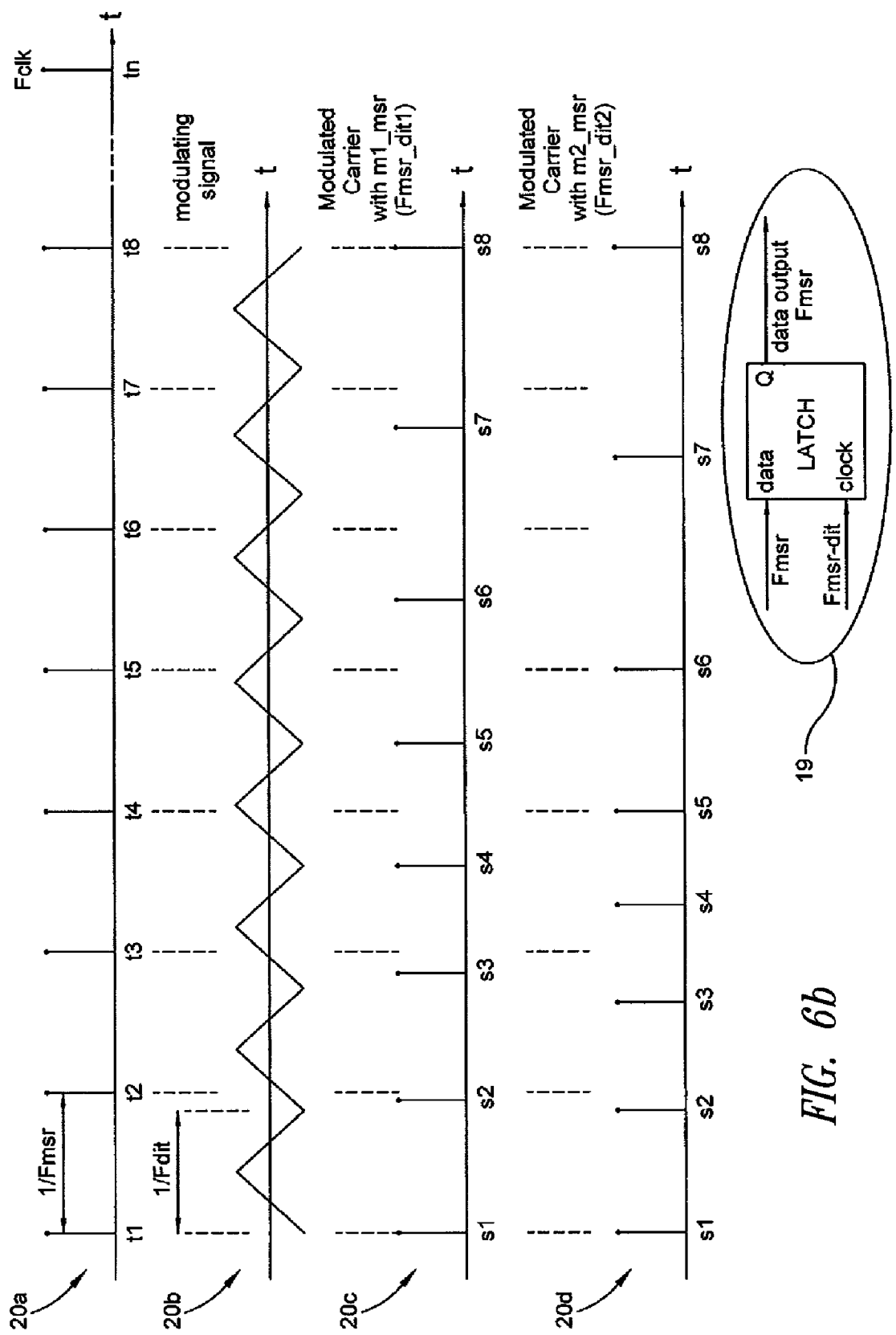

Finally, the apparatus 5b includes a latch array 19 for latching the signal processed by the DSP 8 at the frequency Fmsr_dit with a clock signal having a frequency Fclk (thus undithered) generated by the second PLL 15. At the output of the latch 19, as seen in FIG. 6b, there is the output data signal having a frequency equal to the maximum undithered oversampling frequency Fmsr. Then, such output data signal is converted by the D/A converter 9 and finally transmitted to the loudspeakers (not shown).

Therefore, the second PLL 15 may be used to generate a signal having a fixed frequency Fvco which can provide the maximum oversampling frequency Fmsr without being bound by the above described conditions (1) and (2), whereas the first PLL 10 may be used to generate the dithered signal at the frequency Fvco_dit.

In this case, by providing the apparatus 5b as an integrated digital circuit, a second external loop filter 13 dedicated to the first PLL 10 is no longer needed because, using oscillators 12 and 17 with the same geometry, the current of the oscillator 17, i.e., the undithered oscillator with an external RC circuit, need simply be replicated into the oscillator 12, where the feedback loop with an integrated loop filter 13 is sufficient to make minor bias current corrections caused by mismatches between the two PLLs 10 and 15.

If the condition (2) is imposed on the apparatus 5b for the PLL 10, such condition will allow "proper" operation of the feedback loop of the PLL 10, wherefore the latter will not see the dither effect at the frequency Fdit but, when a Fmsr is desired that is not a multiple of Fdit, i.e., not meeting the condition (1), the following will result:

$$Fclk\_dit/M = Fmsr\_dit \quad (4)$$

which means that the oversampling frequency Fmsr_dit obtained for the audio data at the output of the DSP will be affected by the dither effect.

In consideration of the above, and with reference to FIG. 4a, if the audio output data of the DSP 8 was transmitted to the D/A converter, the audio performance of the loudspeakers would be affected. However, with the embodiment of the apparatus 5b, the data at the frequency Fmsr_dit is transmitted to the latch array 19, which latches it at the frequency Fmsr.

By this operation, the data transmitted to the D/A converter 9 is not affected by any dither effect, which ensures high system performance. Now, it can be noted that, in view of minimizing system complexity (i.e., avoiding the need of using a fully asynchronous machine that can locate in proper time positions the samples from the DSP 8), a constraint shall be imposed on the modulation index m, in addition to the above condition (2), as described below.

Thus, consider the ratio R=Fdit/Fmsr.

By hypothesis, R is not an integer, but anyway rather a rational number. This means that Fmsrdir and Fmsr will come back in phase with a certain periodicity, as shown in FIG. 6b.

The representation of FIG. 6b shows that Fmsr_dit and Fmsr come back in phase every 7 periods.

Particularly, such FIG. 6b includes a plurality of diagrams 20a-20d in which:
 the diagram 20a describes the clock signal at the frequency Fclk,
 the diagram 20b shows the profile of the modulation scheme during implementation, for instance according to a triangular wave at a frequency Fdit;
 the diagram 20c describes the signal at the maximum oversampling frequency Fmsr_dit when modulated with a derived modulation index m1_msr=m1/M;
 the diagram 20d describes the signal at the maximum oversampling frequency Fmsr_dit when modulated with a derived modulation index m2_msr=m2/M.

Assuming that a modulation index "m1" is imposed for the frequency Fclk, then, as a result of the condition (4), the frequency Fmsr_dit is modulated with a derived modulation index m1_msr=m1/M, by determining the profile of type 20c. This clock frequency Fmsr_dit_1 is also the frequency of the audio data bit stream outputted by the DSP 8. In this first example, the modulation index is such that the nth data is latched by the nth clock tick on the latch array 19.

Consider now a second modulation index m2>>m1. In this case, the derived frequency Fmsrd_dit_2 causes a data latching error. Indeed, still with reference to FIG. 6b, the data s5 is sampled at time t4 and the data s4 is lost.

Figure 7:
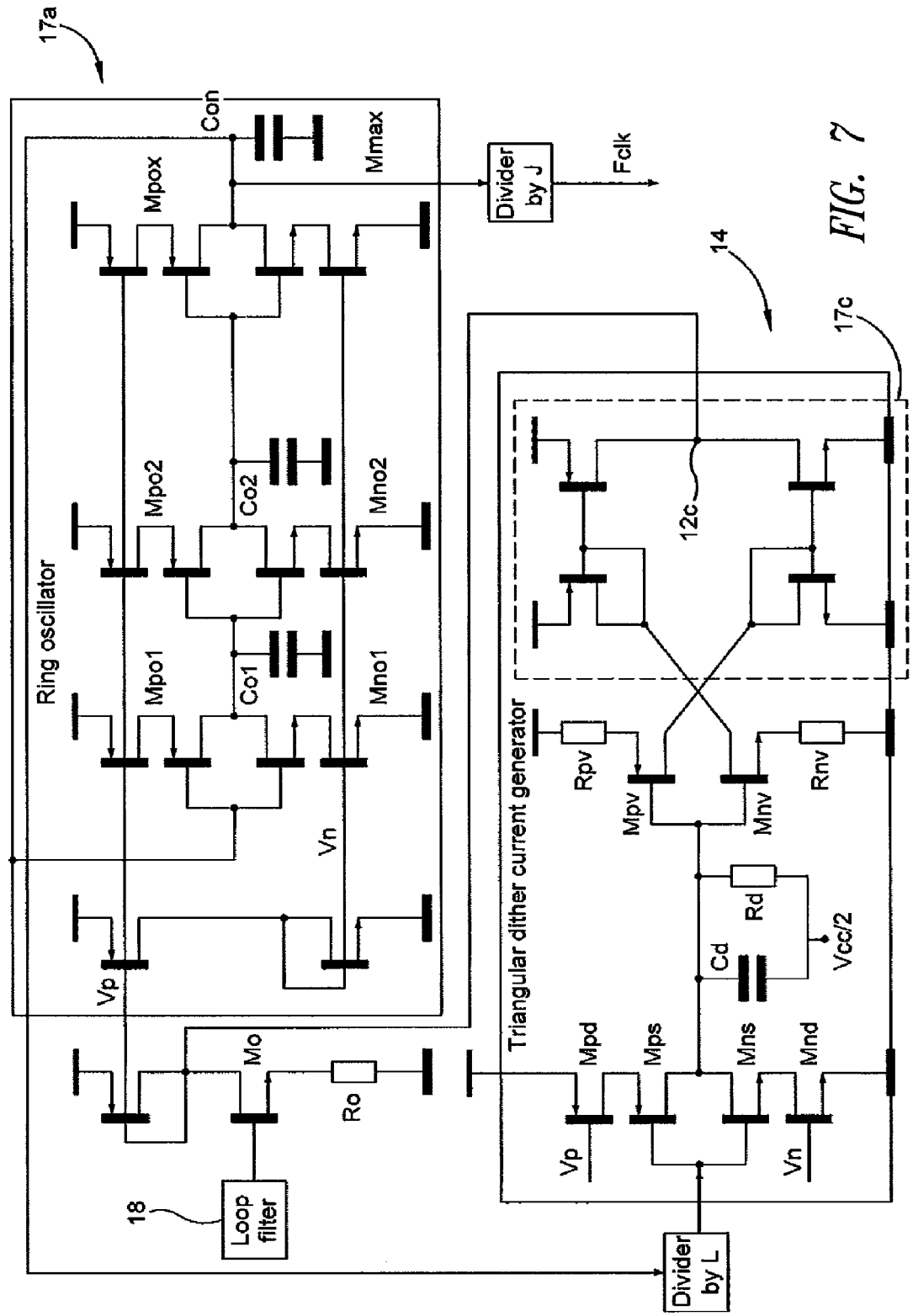

Referring now to FIG. 7, there are shown exemplary circuit diagrams of a few elements of the apparatus 5b as shown in FIG. 6a, particularly of the ring oscillator 17a of the oscillator 17 and the dither generator 7, preferably having a triangular wave operation. It should be noted that, for the purposes hereof, the frequency of the ring oscillator 17a is varied by modulating the current of the generators formed by Mno1, Mpo1, Mno2, Mpo2 and Mnox, Mpox via the voltage to current converter formed by Mo and Ro.

The transistors Mpd, Mnd of the dither generator 7 generate the current that charges/discharges the parallel of Cd/Rd via the switches Mps and Mns driven by a square wave (not shown). The approximated triangular voltage generated by the dither generator 7 is converted into current by the transistors Mpv-Mnv and Rpv-Rnv and is mirrored by the mirror 17c and added by the summing node 12c to the current in the ring oscillator 17 of the VCO 17.

It shall be noted that the multiplicity of the mirror can be easily programmable, as is well known to those of ordinary skill in the art and will not be disclosed herein. Such current has a zero mean in a period 1/Fdit thanks to predetermined frequency ratios, and will not be corrected by the feedback loop 18 of the PLL 15, thereby leading to modulation of the output of the VCO 12 and/or 17 at the frequency Fdit.

Even in case of such an unbalance between the sink and source currents of the triangular dithering wave of the dither generator 7, as to generate a non zero mean current, the feedback loop of the PLL 17 will respond by correcting the main current by the same amount through the voltage-to-current converter Mo-Ro. The matching of the currents of the ring oscillator 17a with those of the dither generator 7, which depends on the area ratio of transistors Mpo-Mno and Mpd-Mnd, on the ratio between Co and Cd, Ro and Rpv-Rnv and between the output frequency of the VCO 17 and on the dithering frequency Fdit ensure proper control of the modulation index "m" as a function of varying frequency.

Those skilled in the art will obviously appreciate that a number of changes and variants may be made to the arrangements as described hereinbefore to meet specific needs, without departure from the scope of the disclosure, as defined in the following claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A process for generating an Analog Audio Output whose frequency varies according to a modulation scheme, the process comprising the steps of:
providing a dither generator that implements a receiving of a first input signal representative of a first clock frequency and generating, according to said modulation scheme, a dithered output signal representative of said first signal at a dithered frequency and comprising a periodic ultrasonic modulating wave; and
providing a DSP that implements a receiving of the following input signals:
said dithered output signal at the dithered frequency and a second signal representative of a second clock frequency, said DSP generating a processed output signal representative of a maximum frequency of said second signal.

2. The process of claim 1 wherein said dithered output signal representative of the dithered frequency is modulated through a first divider so that said signal representative of the dithered frequency is at least equal to or a multiple of said processed output signal, according to the formula:

$$Fclk\_dit = M*Fmsr$$

where Fclk_dit is the dithered output signal representative of the dithered frequency, Fmsr is the processed output signal representative of the maximum frequency of the second signal in an undithered version and M is an integer.

3. The process of claim 1 wherein said dither generator implements said modulation scheme having the ultrasonic modulation, said modulation scheme further comprising a triangular wave modulation scheme.

4. The process of claim 1 wherein said process comprises the steps of:
providing a first PLL comprising a first phase detector responsive to phase deviation between a second input signal, representative of a clock frequency of one of said first clock signal and said second signal and a first feedback signal, said first phase detector driving a first oscillator, according to such deviation, to generate a dithered oscillator output signal, said first PLL further comprising a feedback loop responsive to the dithered output signal generated by said oscillator and generating said first feedback signal through at least one second divider, wherein said first PLL implements the steps of:
providing said dither generator for implementing said modulation scheme having a periodic ultrasonic wave to modulate said first oscillator and generate said dithered oscillator output signal;
varying the frequency of said periodic ultrasonic modulating wave of said dither generator so that said frequency is equal to or multiple of the frequency of the second input signal of said phase detector, wherein $$Fdit = N*Fphd\_loop\_1$$

where Fdit is the frequency of said periodic ultrasonic modulating wave of said dither generator, Fphd_loop_1 is the frequency of said feedback signal, N is an integer, and the frequency Fphd_loop_1 is, in steady-state conditions, equal to the frequency of the second input signal of said phase detector.

5. The process of claim 4 wherein said dithered output signal generated by said first oscillator is modulated through at least one third divider to obtain, at the output of said third divider, said dithered output signal representative of the dithered frequency.

6. The process of claim 4 wherein said second input signal representative of a clock frequency through a fourth divider is said first clock signal representative of a clock frequency or said second signal representative of a clock frequency.

7. The process of claim 4 wherein said dithered output signal representative of the dithered frequency is processed by said DSP for generating, at the output thereof, said processed signal in an undithered version.

8. The process of claim 1 comprising the steps of:
providing a second PLL comprising a second phase detector responsive to phase deviation between said second input signal, representative of a clock frequency and a second feedback signal, said phase detector driving a second oscillator, according to said deviation, to generate an undithered oscillator output signal, said second PLL further comprising a feedback loop responsive to the undithered output signal generated by said oscillator and generating said second feedback signal through at least one fifth divider, wherein said second PLL is configured to implement the steps of:
modulating said undithered output signal generated by said second oscillator through at least one sixth divider to obtain said processed output signal in the undithered version;
varying the frequency of said periodic ultrasonic modulating wave of said dither generator according to said undithered oscillator output signal to modulate said first oscillator and thus generate said dithered oscillator output signal;
modulating said dithered oscillator output signal through a seventh divider to obtain, at the output of said seventh divider said signal representative of the dithered frequency;
generating, at the output of said DSP, said processed signal in the dithered version, said DSP receiving at its input said signal representative of the dithered frequency and said second signal representative of a clock frequency,
latching said processed signal in the dithered version and said undithered output signal.

9. An apparatus for generating an Analog Audio Output signal whose frequency varies according to a modulation scheme, said apparatus comprising:
a dither generator for receiving a first input signal representative of a clock frequency and for generating, according to said modulation scheme, an output signal representative of a dithered frequency; and
a DSP for receiving said input signal representative of the dithered frequency and a second signal representative of a clock frequency, said DSP being adapted to generate a processed output signal representative of the maximum frequency of said second signal, wherein said dither generator operates at a frequency imposed by said modulation scheme, said modulation scheme being a modulation scheme having a periodic ultrasonic modulating wave.

10. The apparatus of claim 9 wherein said DSP comprises a first divider for receiving said input signal representative of the dithered frequency so that said signal representative of the dithered frequency is at least equal to or multiple of said processed signal, according to the formula:

$$Fclk\_dit = M * Fmsr$$

where Fclk_dit is the signal representative of the dithered frequency, Fmsr is the signal representative of the maximum frequency of the second signal in the undithered version and M is an integer.

11. The apparatus of claim 9 wherein said apparatus comprises:
a first PLL comprising a first phase detector responsive to phase deviation between an input signal representative of a clock frequency and a first feedback signal, said first phase detector adapted to drive a first oscillator, according to such deviation, to generate a dithered oscillator output signal, said first PLL further comprising a feedback loop responsive to the dithered output signal generated by said oscillator and generating said first feedback signal through at least one second divider, wherein said first PLL comprises:
said dither generator having a periodic ultrasonic wave to modulate said first oscillator and generate said dithered oscillator output signal;
a first circuit for varying the frequency of said periodic ultrasonic modulating wave of said dither generator so that said frequency is equal to or multiple of the frequency of the input signal of said phase detector, in which:

$$Fdit = N * Fphd\_loop\_1$$

where Fdit is the frequency of said periodic ultrasonic modulating wave, Fphd_loop_1 is the frequency of said feedback signal, N is an integer and the frequency Fphd_loop_1 being, in steady-state conditions, equal to the frequency of the input signal of said first phase detector.

12. The apparatus of claim 11, comprising a third divider for receiving, at the input thereof, said dithered output signal generated by said first oscillator and for generating said output signal representative of the dithered frequency.

13. The apparatus for generating an output signal having a variable frequency as claimed in claim 11, comprising a fourth divider for receiving, at the input thereof, said first signal representative of a clock frequency or said second signal representative of a clock frequency and for generating said input signal.

14. The apparatus of claim 10 wherein said apparatus comprises:
a second PLL comprising a second phase detector responsive to phase deviation between said input signal representative of a clock frequency and a second feedback signal, said second phase detector adapted to drive a second oscillator, according to such deviation, to generate an undithered oscillator output signal, said second PLL further comprising a feedback loop responsive to the undithered output signal generated by said second oscillator and generating said second feedback signal through at least one fifth divider, wherein said second PLL comprises:
a sixth divider for receiving said undithered output signal generated by said second oscillator and for obtaining said processed output signal in the undithered version;
a second circuit for varying the frequency of said periodic ultrasonic modulating wave of said dither generator according to said undithered oscillator output signal to modulate said first oscillator and thus generate said dithered oscillator output signal;
a seventh divider for receiving, at the input thereof, said dithered oscillator output signal and for obtaining, at the output of said seventh divider said signal representative of the dithered frequency;
said DSP receiving at its input, said signal representative of the dithered frequency and said second signal representative of a clock frequency and generating at its output said processed signal in the dithered version,
a latch array for latching said processed signal in the dithered version and said undithered output signal.

15. A method, comprising:
receiving a first clock signal;
generating a dithered output signal responsive to the first clock signal, the dithered output signal comprising a periodic ultrasonic modulating wave in accordance with a modulation scheme;
receiving a second clock signal and the dithered output signal; and
generating a processed output signal in response to the second clock signal and the dithered output signal for generating an audio output signal.

16. The method of claim 15 wherein generating the dithered output signal with a periodic ultrasonic modulating wave in accordance with a modulation scheme comprises using a triangular wave modulation scheme.

17. The method of claim 15 wherein generating the dithered output signal comprises modulating the dithered output signal so that the dithered output signal is a multiple of or equal to an oversampling frequency.

18. The method of claim 17 wherein the oversampling frequency comprises a maximum oversampling frequency of the second clock signal.

19. The method of claim 15 wherein generating the dithered output signal comprises modulating a first oscillator with the modulation scheme having the periodic ultrasonic wave to generate the dithered output signal, and further wherein modulating the dithered output signal comprises varying a frequency of the periodic ultrasonic modulating wave so that the frequency of the dithered output signal is equal to or a multiple of the oversampling frequency.

20. The method of claim 19, comprising generating an undithered oscillator output signal and modulating the undithered output signal by a second oscillator to obtain an undithered version of the processed output signal and latching the undithered version of the processed output signal and the processed output signal in a latch.

* * * * *